United States Patent
Knierim

(10) Patent No.: US 9,525,427 B1
(45) Date of Patent: Dec. 20, 2016

(54) TEST AND MEASUREMENT INSTRUMENT INCLUDING ASYNCHRONOUS TIME-INTERLEAVED DIGITIZER USING HARMONIC MIXING AND A LINEAR TIME-PERIODIC FILTER

(71) Applicant: Tektronix, Inc., Beaverton, OR (US)

(72) Inventor: Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/851,937

(22) Filed: Sep. 11, 2015

(51) Int. Cl.
*G01R 23/14* (2006.01)
*H03M 1/12* (2006.01)

(52) U.S. Cl.
CPC ..................... *H03M 1/121* (2013.01)

(58) Field of Classification Search
CPC .................................................... H03M 1/121
USPC ............... 341/118, 120, 155, 166; 324/76.23
See application file for complete search history.

(56) References Cited

U.S. PATENT DOCUMENTS

| | | | | |
|---|---|---|---|---|
| 5,659,546 A | * | 8/1997 | Elder | H03M 1/121 370/343 |
| 6,269,317 B1 | * | 7/2001 | Schachner | G01R 35/002 324/94 |
| 7,183,953 B2 | * | 2/2007 | Kadota | H03M 1/1038 341/118 |
| 8,742,749 B2 | * | 6/2014 | Knierim | H03M 1/121 324/76.23 |

* cited by examiner

*Primary Examiner* — Khai M Nguyen
(74) *Attorney, Agent, or Firm* — Marger Johnson; Michael A. Nelson

(57) ABSTRACT

A test and measurement instrument, including a splitter configured to split an input signal having a particular bandwidth into a plurality of split signals, each split signal including substantially the entire bandwidth of the input signal, a plurality of harmonic mixers, each harmonic mixer configured to mix an associated split signal of the plurality of split signals with an associated harmonic signal to generate an associated mixed signal, a plurality of digitizers, each digitizer configured to digitize a mixed signal of an associated harmonic mixer of the plurality of harmonic mixers, and a linear time-periodic filter configured to receive the digitized mixed signal from each of the digitizers and output a time-interleaved signal. A first-order harmonic of at least one harmonic signal associated with the harmonic mixers is different from a sample rate of at least one of the digitizers.

14 Claims, 2 Drawing Sheets

TEST AND MEASUREMENT INSTRUMENT INCLUDING ASYNCHRONOUS TIME-INTERLEAVED DIGITIZER USING HARMONIC MIXING AND A LINEAR TIME-PERIODIC FILTER

TECHNICAL FIELD

This invention relates to test and measurement instruments and, more particularly, to test and measurement instruments including one or more asynchronous time-interleaved digitizers, which use harmonic mixing for reducing noise.

BACKGROUND

Useable bandwidths of test and measurement instruments, such as digital oscilloscopes, can be limited by an analog to digital converter (ADC) used to digitize input signals. The useable bandwidth of an ADC can be limited to the lesser of the analog bandwidth or one half of a maximum sample rate of the ADC. Various techniques have been developed to digitize higher bandwidth signals with existing ADCs.

For example, synchronous time-interleaving can be used to achieve an effective higher sample rate. Multiple ADCs can sample an input signal offset in time within a single sample period. The digitized outputs can be combined together for an effectively multiplied sample rate. However, if the analog bandwidth of the ADCs becomes the limiting factor, a high bandwidth front end, such as a multi-way interleaved track and hold amplifier is needed to achieve a higher bandwidth.

Conventional track and hold amplifier-based time-interleaved systems cause the track and hold amplifier to be clocked at a sample rate similar to or slower than the ADC channel bandwidth so that the ADC will have sufficient time to settle to the held value. The ADC is synchronously clocked to the track and hold amplifier to digitally capture each held value. Such a limitation on the track and hold amplifier in turn limits the ADC sample rate. Moreover, to satisfy the Nyquist sampling theorem, the ADC sample rate is lowered to less than twice the bandwidth of the ADC channel. As a result, many time-interleaved ADC channels are needed to achieve the desired performance.

As the number of ADC channels increases, the overall cost and complexity of the system also increases. For instance, the front end chip must now drive more ADC channels, including additional ADC circuitry, clocking circuitry, or the like, to get the overall net sample rate up to a suitable value. The size and complexity of the chip also results in longer communication paths, and therefore, an increase in parasitic capacitance, electromagnetic noise, design difficulties, and so forth.

In another technique, sub-bands of an input signal can be downconverted to a frequency range that can be passed through a lower sample rate ADC. In other words, the wide input bandwidth can be split into multiple lower-bandwidth ADC channels. After digitization, the sub-bands can be digitally upconverted to the respective original frequency ranges and combined into a representation of the input signal. One significant disadvantage of this technique is the inherent noise penalty when digitizing an arbitrary input signal whose frequency content may be routed to only one ADC channel. The recombined output will contain signal energy from only one ADC, but noise energy from all ADCs, thereby degrading the Signal-to-Noise Ratio (SNR).

Accordingly, a need remains for improved devices and methods for digitizing any frequency input signal by all ADC channels in an asynchronous time-interleaved architecture, thereby avoiding the noise penalty.

U.S. Pat. No. 8,742,749, titled TEST AND MEASUREMENT INSTRUMENT INCLUDING ASYNCHRONOUS TIME-INTERLEAVED DIGITIZER USING HARMONIC MIXING, issued Jun. 3, 2014, incorporated by reference herein in its entirety, discusses an asynchronous time-interleaved system with a reconstruction algorithm to reconstruct the signal after the signal has been split and processed.

SUMMARY

Embodiments of the disclosed technology are directed to a test and measurement instrument, including a splitter configured to split an input signal having a particular bandwidth into a plurality of split signals, each split signal including substantially the entire bandwidth of the input signal; a plurality of harmonic mixers, each harmonic mixer configured to mix an associated split signal of the plurality of split signals with an associated harmonic signal to generate an associated mixed signal; a plurality of digitizers, each digitizer configured to digitize a mixed signal of an associated harmonic mixer of the plurality of harmonic mixers; and a linear time-periodic filter configured to receive the digitized mixed signal from each of the digitizers and output a time-interleaved signal. A first-order harmonic of at least one harmonic signal associated with the harmonic mixers is different from an effective sample rate of at least one of the digitizers.

Embodiments of the disclosed technology are also directed to a method including splitting an input signal having a particular bandwidth into a plurality of split signals, each split signal including substantially the entire bandwidth of the input signal; mixing each split signal with an associated harmonic signal to generate an associated mixed signal; digitizing each mixed signal; receiving the digitized mixed signal from each of the digitizers at a linear time-periodic filter; and outputting a time-interleaved signal from the linear time-periodic filter. A first-order harmonic of at least one harmonic signal associated with the harmonic mixers is different from a sample rate of at least one of the digitizers

DETAILED DESCRIPTION

Figure 1:
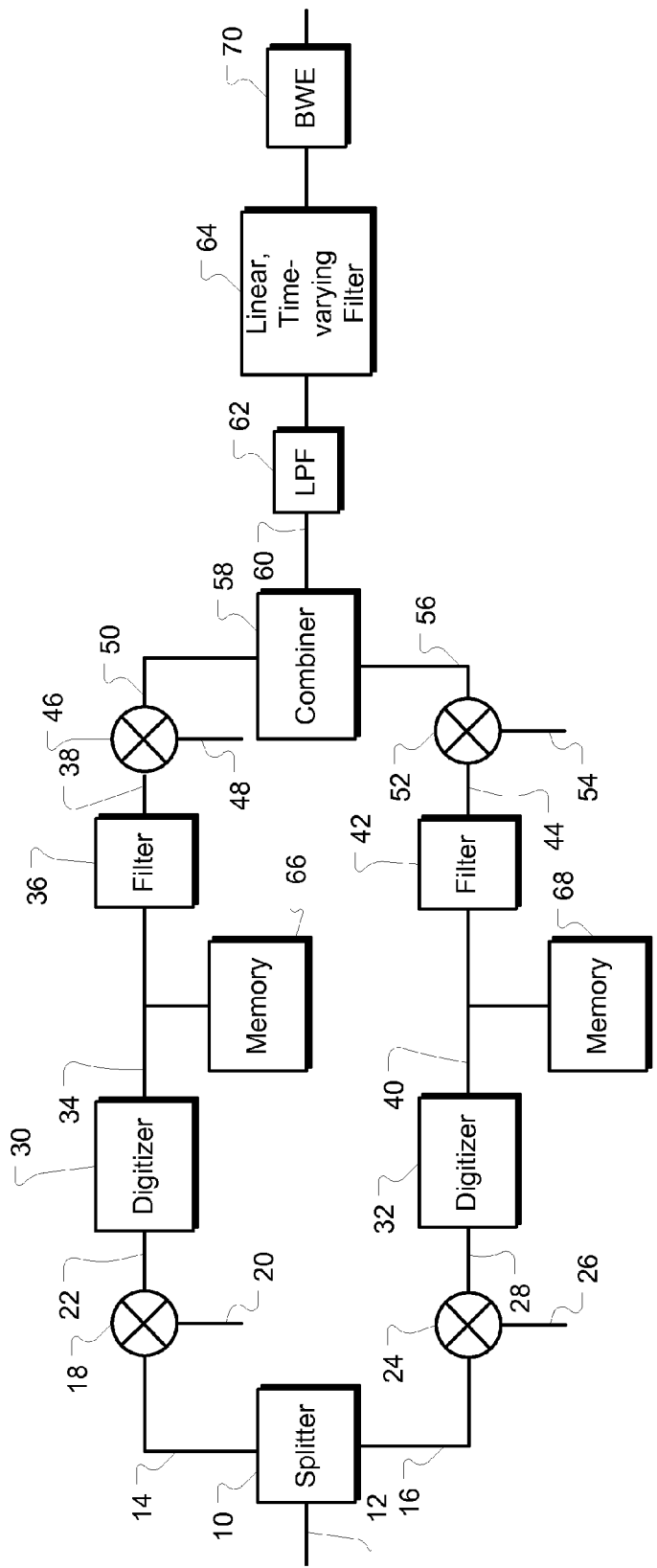
FIG. 1 is a block diagram of an ADC system for a test and measurement instrument using harmonic mixing.

FIG. 1 is a block diagram of an ADC system for a test and measurement instrument using harmonic mixing. In this embodiment, the instrument includes a splitter 10 configured to split an input signal 12 having a particular frequency spectrum into multiple split signals 14 and 16, each split signal including substantially the entire spectrum of the input signal 12. A splitter 10 can be any variety of circuitry that can split the input signal 12 into multiple signals. For example, the splitter 10 can be a resistive divider. Thus, substantially all frequency components of the input signal 12 can be present in each split signal 14 and 16. However, depending on the number of paths, harmonic signals used, or the like, the frequency responses for various split signals of a splitter 10 can be different.

The split signals 14 and 16 are inputs to harmonic mixers 18 and 24, respectively. Harmonic mixer 18 is configured to mix the split signal 14 with a harmonic signal 20 to generate a mixed signal 22. Similarly, harmonic mixer 24 is configured to mix the split signal 16 with a harmonic signal 26 to generate a mixed signal 28.

As used herein, a harmonic mixer is a device configured to mix a signal with multiple harmonics. Although multiplication and/or mixing has been described in connection with harmonic mixing, a device that has the effect of multiplying a signal with multiple harmonics can be used as a harmonic mixer.

A digitizer 30 is configured to digitize mixed signal 22. Similarly, a digitizer 32 is configured to digitize mixed signal 28. The digitizers 30 and 32 can be any variety of digitizer. Although not illustrated, each digitizer 30 and 32 can have a preamplifier, filter, attenuator, and other analog circuitry as needed. Thus, the mixed signal 22 input to the digitizer 30, for example, can be amplified, attenuated, or otherwise filtered before digitization.

The digitizers 30 and 32 are configured to operate at an effective sample rate. The effective sample rate is a rate that allows the digitizers 30 and 32 to adequately digitize the signals 22 and 28, and may be chosen, for example, to optimize the signal-to-noise ratio within the frequency band of interest within signals 22 and 28. In some embodiments, the digitizer 30 can include a single analog to digital converter (ADC). However, in other embodiments, the digitizer 30 can include multiple interleaved ADCs operating at lower sample rates to achieve a higher effective sample rate.

A first-order harmonic of at least one of the harmonic signals 20 and 26 is different from an effective sample rate of at least one of the digitizers 30 and 32. In some embodiments, the first-order harmonic of a harmonic signal need not be an integer multiple or sub-multiple of the effective sample rate of the at least one of the digitizers. In other words, in some embodiments, the first-order harmonic of a harmonic signal associated with the harmonic mixers is not an integer multiple or sub-multiple of the effective sample rate of the at least one of the digitizers.

It should be understood that all bands of the input signal 12 go through all paths. In other words, when more than one channel is combined for processing a single input signal 12, each channel or path receives substantially the entire bandwidth of the input signal 12. As the input signal 12 is transmitted through all of the digitizers, the signal to noise ratio is significantly improved.

A filter 36 can be configured to filter the digitized mixed signal 34 from digitizer 30. Similarly, a filter 42 can be configured to filter the mixed signal 40 from digitizer 32. Filters 36 and 42 may be, for example, equalization and interpolation filters. Harmonic mixers 46 and 52 are configured to mix the filtered mixed signals 38 and 44 with harmonic signals 48 and 54, respectively. In some embodiments, the harmonic signals 48 and 54 can be substantially similar in frequency and phase to the corresponding harmonic signals 20 and 26. While the harmonic signals 20 and 26 are analog signals, and the harmonic signals 48 and 54 are digital signals, the scaling factors for these harmonic signals can be the same or similar to each other. The output signals 50 and 56 are referred to as remixed signals 50 and 56. A combiner 58 is configured to combine the remixed signals 50 and 56 into a reconstructed input signal 60. In some embodiments, the combiner 58 can implement more than mere addition of signals. For example, averaging, filtering, scaling, or the like can be implemented in the combiner 58. That is, the combiner 58 may include a low-pass filter (LPF) 62 or the LPF 62 may be placed outside the combiner, as shown in FIG. 1.

The filters 36 and 42, the harmonic mixers 46 and 52, harmonic signals 48 and 54, the combiner 58, and other associated elements can be implemented digitally. For example, a digital signal processor (DSP), microprocessor, programmable logic device, general purpose processor, or other processing system with appropriate peripheral devices as desired can be used to implement the functionality of the processing of the digitized signals. Any variation between complete integration to fully discrete components can be used to implement the functionality.

For example, some filtering can occur prior to digitization. The mixed signals 22 and 28 could be filtered with a low pass filter having a cutoff frequency near one half of the effective sample rate of the digitizers 30 and 32. The filtering of filters 36 and 42 can add to such inherent and/or induced filtering.

In some embodiments, the net filtering of the mixed signals 22 and 28 can result in a frequency response that is substantially complementary about one half of a frequency of the first-order harmonic of the harmonic signals 20 and 26. That is, the frequency response at a given offset higher than frequency $F_1/2$ and the frequency response at a given offset lower than frequency $F_1/2$ can add to one. Although one has been used as an example, other values can be used as desired, such as for scaling of signals. Furthermore, the above example is described as an ideal case. That is, the implemented filtering can have different response to account for non-ideal components, calibration, or the like.

In the event of interleaving errors due to analog mismatch, hardware adjustments can be made for mixing clock amplitude and phase. The adjustments can then be calibrated to minimize interleave mismatch spurs. Alternatively, or in addition to the above approach, hardware mismatches can be characterized, and a linear, time-varying correction filter 64 may be used to cancel the interleave spurs.

Moreover, although the digital filtering, mixing, and combining have been described as discrete operations, such operations can be combined, incorporated into other functions, or the like. In addition, as the above discussion assumed ideal components, additional compensation, can be introduced into such processing as appropriate to correct for non-ideal components. Furthermore, when processing the digitized signals, changing frequency ranges, mixing, and the like can result in a higher sample rate to represent such changes. The digitized signals can be upsampled, interpolated, or the like as appropriate.

A memory 66 may be provided between digitizer 30 and filter 36 in the upper ADC channel and a memory 68 between digitizer 32 and filter 42 in the lower ADC channel. An acquisition can be performed and the digitized mixed signal 34 or the digitized mixed signal 40 can be stored in memories 66 and 68, respectively, before being sent to filters 36 and 42, respectively.

As discussed above, the reconstruction applies equalization/interpolation filters 36 and 42 to the ADC data streams, mixes them with a digital version of the harmonic mixing function via harmonic mixers 46 and 52, averages the results via combiner 58, low-pass filters 62 the averaged results to remove upper mixing products, and then applies a linear, time-varying correction filter 64. All of these steps are linear operators, i.e. for any scalars a and b and input signals x(t) and y(t), $$F\{a \cdot x(t) + b \cdot y(t)\} = a \cdot F\{x(t)\} + b \cdot F\{y(t)\} \quad (1)$$

Since digital signal processors are used, time is represented in discrete time intervals, represented by an integer value "t," where each increment of t represents one sample point of time. The sample interval between adjacent points in time, for example, may be 5 ps. However, any other sample interval may be used.

The equalization/interpolation filters 36 and 42 and low-pass filter 62 are time-invariant as well as linear, i.e., $$F\{x(t-t_0)\} = F\{x(t)\}|t-t_0 \quad (2)$$

The variable to is any arbitrary integer time delay. These filters will be referred to herein as linear time-invariant (LTI) filters. An LTI filter can be fully and uniquely represented by its impulse response, and a cascade of LTI filter components is also an LTI filter, with an impulse response equal to the convolution of the components' impulse responses.

The mixing functions 48 and 54 and linear, time-varying correction filter 64 vary over time. However, if the mixing frequency is harmonically related to the underlying ADC interleaving rate, both steps will be time-periodic, i.e., $$F\{x(t-kT)\} = F\{x(t)\}|t-kT \quad (3)$$

The variable k is any integer and T is the least common period of the mixing function and the interleave rate. These are referred to as linear, time-periodic filters ("LTP"). For example, the mixing function may be 75 GHz, the interleave rate is 12.5 GS/s, and T=16, which at 5 ps per sample point represents 80 ps. The mixing function is being viewed as a filter with a single coefficient, one point duration impulse response, which varies periodically over time (completing six cycles in 16 samples in this example).

LTI filters may be a subclass of LTP filter by letting $t_0$=kT. Thus, the reconstruction may be represented as a cascade of LTP filters.

An LTP filter can be fully and uniquely represented by an array of T impulse responses, where T is the integer period of the LTP filter. Array entry 0 equals the response of the filter to an impulse at time t=0, array entry 1 equals the response of the filter to an impulse at time t=1 advanced by one sample, array entry 2 equals the response of the filter to an impulse at time t=2 advanced by two samples, etc. Note that if an array entry is defined at T, it would be the response of the filter to an impulse at the time t=T advanced by T samples, but by the periodicity property that is identical to the response of an impulse at t=0, which is already stored in array entry 0. Hence, the array of T impulse responses defines the response to an impulse at any time, and by linearity, the response to any signal (represented as a linear combination of impulses at different times) can be determined. An LTI filter, as a subclass of LTP filters of period T, would be represented by having all T entries identical.

An LTP filter response of duration N samples can be stored as a two-dimensional T by N array, indexed by the input impulse location (modulo T) and the output sample. For simplicity of notation, let bold font represent modulo T, i.e., $$\mathbf{i} = i(\text{modulo } T) \quad (4)$$

Then, the output y(t) of an LTP filter "f" can be expressed in terms of its input x(t) akin to a convolution:

$$y(t) = x(t)*f = \Sigma_i x(i) \cdot f(\mathbf{i}, t-i) \quad (5)$$

Likewise, the output y(t) of a cascade of two LTP filters "f" and "g" can be expressed in terms of its input x(t):

$$y(t) = [x(t)*f]*g = \Sigma_j [\Sigma_i x(i) \cdot f(\mathbf{i}, j-i)] \cdot g(\mathbf{j}, t-j) = \Sigma_i x(i) \cdot [\Sigma_j f(\mathbf{i}, j-i) \cdot g(\mathbf{j}, t-j)] = \Sigma_i x(i) \cdot \{f*g\}(\mathbf{i}, t-i) \quad (6)$$

Where {f*g}(i,m) is defined as:

$$\{f*g\}(\mathbf{i}, m) = \Sigma_k f(\mathbf{i}, k) \cdot g(\mathbf{i+k}, m-k) \quad (7)$$

Thus, the "periodic convolution" of LTP filters f and g can be pre-calculated, the result can be stored as LTP filter f*g, and the input x can be convolved with this new filter to calculate the output y. In a similar fashion, the "periodic convolution" of any number of LTP filters (such as all the steps of the reconstruction algorithm) may be pre-calculated and just one LTP filter may be applied to the data at runtime.

The "periodic convolution" of LTP filters follows the associative rule, as does the convolution of LTI filters, as shown in equation (8):

$$(f*g)*h = f*(g*h) \quad (8)$$

However, the communicative rule does not apply to LPT filters as it does to LTI filters. That is, equation (9) applies to LTI filters, but not necessarily to LTP filters:

$$f*g = g*f \quad (9)$$

The first step of reconstruction applies an equalization and interpolation filter 36 or 42 to each ADC channel's data stream. The output rate of the equalization and interpolation filters 36 and 42 is generally N times the input rate (where N is the number of interleaved digitizers), and this is often viewed as a two-step process: inserting N−1 zero samples between the ADC samples to achieve N times the data rate, then applying a low-pass LTI filter at the higher rate to remove the aliased energy created by the alternating samples and zeroes. When representing this loss-pass filter as an LTP filter, though, N−1 of N entries in the array of T impulse responses can be set to zero, so rather than inserting zero samples to increase the rate, any arbitrary samples may be inserted since they will subsequently get multiplied by a zero impulse response. For example, the ADC samples from the other N−1 ADC channel(s) may be inserted.

This approach can be used for all equalization and interpolation filters 36 and 42, choosing the non-zero rows in each array to correspond with the associated digitizer's samples. This allows the same interleaved data stream, containing interleaved samples from all ADC channels, to be fed into all equalization and interpolation filters 36 and 42, and by linearity, the N resultant LTP filters representing the N paths may be added to obtain a single LTP filter to output a reconstructed data stream. The whole reconstruction process then may become applying a single LTP filter to the ADC data, taken as an interleaved stream.

As when convolving LTI filters, the duration of the response of several convolved LTP filters will generally be the sum of the durations of the component filters, minus the number of filters convolved, plus one. However, the filter coefficients near either end are likely to be very small, both because there are fewer non-zero terms to add together in the summation and because those terms that do get added are the product of coefficients from near the end of the component filter responses, which tend to be small, making their product "small squared" or very small. Thus, the duration of the final convolved LTP filter may be practically limited to something less than the theoretical combinations discussed above, saving even more execution time. In some embodiments, applying a smooth windowing function may be useful to avoid an abrupt truncation of the response.

This allows the entire reconstruction algorithm to be reduced to an application of a single LTP filter to the interleaved ADC data stream, thus reducing processing time and allowing faster update rates at long record lengths. That is, an LTP system may be defined as a cascade of LTP filters and be characterized as a single LTP filter by use of periodic convolution. Alternatively, any algorithm that is known to be linear and time-periodic, i.e., is an LTP system, may be characterized as a single LTP filter by application of the algorithm to T input records, where each input record is an impulse at location t, where 0≤t<T. This technique directly measures the impulse responses which, after advancing by t samples, are stored in the impulse response array of the single LTP filter. This direct determination of the system impulse response array can be applied to any LTP system, even if implemented inside a "black-box" wherein the operation of the algorithm cannot be directly observed. For example, this approach of directly determining the impulse response can be used with a system in a "black-box" whether that system internally operates as a cascade of LTP components or uses some other processing technique, e.g., frequency domain analysis.

Pre-calculation of the LTP system impulse response array will take time, whether done using periodic convolutions of the components or applying the black-box measurement approach. The execution time savings, then, comes from assuming that the duration of the record(s) to be reconstructed by one LTP filter are long compared to the duration of the LTP system response. This assumption is often valid, as the record lengths may go into the millions of samples, whereas the system response duration is in the hundreds of samples.

However, if a user requests shorter records and triggers them far enough apart to require recalculating the LTP filter to account for hardware drift, it may be faster to apply each LTP component to the data record in cascade. On the other hand, processing throughput may not be an issue in this case with short records and slow triggers.

After reconstruction, a band width enhancement (BWE) filter 70 may be applied using a much longer duration LTI filter using frequency domain techniques. If this filter is much longer in duration than any of the LTP filters, it may be kept separate. Treating the BWE filter 70 as part of the LTP cascade, though mathematically accurate, would require calculating T (16 in the examples above) long-duration responses which would complicate and potentially slow the frequency-domain filtering technique in use. The periodic convolution technique applies best when incorporating LTI filter durations less than or comparable to the longest inherently time varying filter duration.

Figure 2:
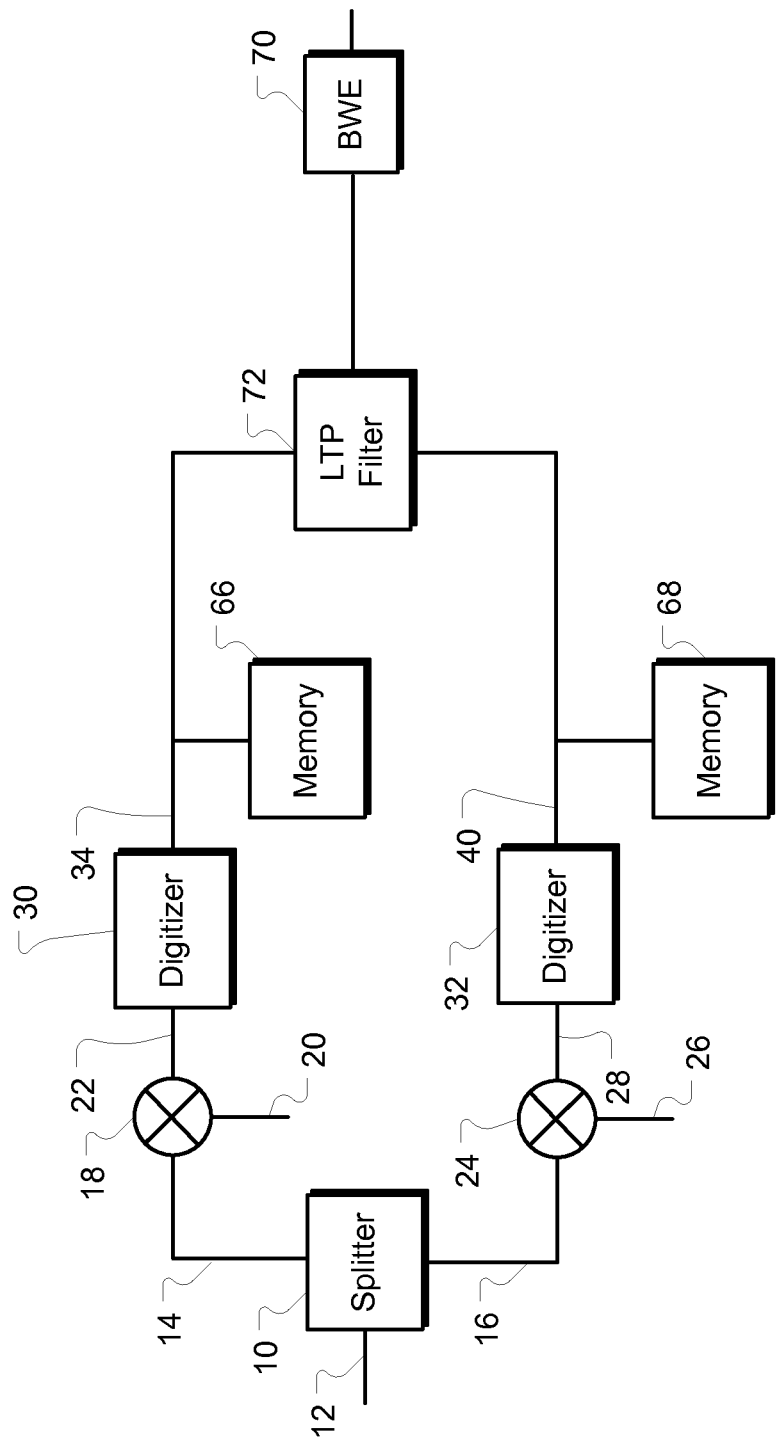
FIG. 2 is a block diagram of an ADC system for a test and measurement instrument using harmonic mixing according to some embodiments of the disclosed technology.

FIG. 2 illustrates the filters 36 and 42, harmonic mixers 46 and 52, combiner 58, low-pass filter 62, and linear-time varying filter 64 as a single convolved LTP filter 72. That is, the output from the digitizer 30 and digitizer 32 may be inputted directly into the LTP filter 72, rather than through each of the components shown in FIG. 1. The LTP filter 72 outputs reconstructed interleaved signal.

Although FIG. 2 illustrates the filters 36 and 42, harmonic mixers 46 and 52, combiner 58, low-pass filter 62, and linear-time varying filter 64 as being convolved into a single LTP filter 72, multiple LTP filters may be used instead of a single LTP filter. Alternatively, LTP filter 72 may include two or more of filters 36 and 42, harmonic mixers 46 and 52, combiner 58, low-pass filter 62, and linear-time varying filter 64, while the filters not convolved remain.

Another embodiment includes computer readable code embodied on a computer readable medium that when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

Although particular embodiments have been described, it will be appreciated that the principles of the invention are not limited to those embodiments. Variations and modifications may be made without departing from the principles of the invention as set forth in the following claims. For example, it is anticipated that a re-ordering of the digital filtering, mixing, and/or combining may allow for more efficient execution of the digital processing while still providing for reconstruction of a digital representation of the input signal.

What is claimed is:

1. A test and measurement instrument, comprising:
   a splitter configured to split an input signal having a particular bandwidth into a plurality of split signals, each split signal including substantially the entire bandwidth of the input signal;
   a plurality of harmonic mixers, each harmonic mixer configured to mix an associated split signal of the plurality of split signals with an associated harmonic signal to generate an associated mixed signal;
   a plurality of digitizers, each digitizer configured to digitize a mixed signal of an associated harmonic mixer of the plurality of harmonic mixers; and
   a linear time-periodic filter configured to receive the digitized mixed signal from each of the digitizers and output a time-interleaved signal,
   wherein a first-order harmonic of at least one harmonic signal associated with the harmonic mixers is different from a sample rate of at least one of the digitizers.

2. The test and measurement instrument of claim 1, wherein the linear time-periodic filter is a convolution of at least two linear time-periodic filters.

3. The test and measurement instrument of claim 1, wherein the linear time-periodic filter is configured to equalize each of the digitized mixed signals.

4. The test and measurement instrument of claim 1, wherein the linear time-periodic filter is configured to interpolate each of the digitized mixed signals.

5. The test and measurement instrument of claim 1, wherein the linear time-periodic filter is configured to mix the digitized mixed signal from each of the digitizers with an associated harmonic signal.

6. The test and measurement instrument of claim 1, wherein the linear time-periodic filter is configured to combine each of the digitized mixed signal into a combined signal.

7. The test and measurement instrument of claim 6, wherein the linear time-periodic filter is further configured to low-pass filter the combined signal.

8. The test and measurement instrument of claim 6, wherein the linear time-periodic filter is further configured to perform interleave correction of the combined signal.

9. The test and measurement instrument of claim 1, further comprising a band width enhancement filter configured to filter the time-interleaved signal.

10. A method for a test and measurement instrument, comprising:
    splitting an input signal having a particular bandwidth into a plurality of split signals, each split signal including substantially the entire bandwidth of the input signal;
    mixing each split signal with an associated harmonic signal to generate an associated mixed signal;

digitizing each mixed signal;
receiving the digitized mixed signal from each of the digitizers at a linear time-periodic filter; and
outputting a time-interleaved signal from the linear time-periodic filter,
wherein a first-order harmonic of at least one harmonic signal associated with the harmonic mixers is different from a sample rate of at least one of the digitizers.

11. The method of claim 10, wherein the linear time-periodic filter is a convolution of a plurality of linear time-periodic filters.

12. The method of claim 10, further comprising receiving the time-interleaved signal at a bandwidth enhancement filter and filtering the time-interleaved signal.

13. The method of claim 10, wherein the linear time-periodic filter equalizes each of the digitized mixed signals, interpolates each of the equalized, digitized mixed signals, mixes the digitized mixed signal from each of the digitizers with an associated harmonic signal, combines each of the digitized mixed signal into a combined signal, low-pass filters the combined signal and performs interleave correction of the combined signal.

14. The method of claim 10, wherein the linear time-periodic filter includes a cascade of a plurality of time-periodic filters.

* * * * *